US009263351B2

(12) United States Patent
Wang et al.

(10) Patent No.: US 9,263,351 B2
(45) Date of Patent: Feb. 16, 2016

(54) METHOD OF FORMING AN INTEGRATED INDUCTOR BY DRY ETCHING AND METAL FILLING

(71) Applicant: Fudan University, Shanghai (CN)

(72) Inventors: Pengfei Wang, Shanghai (CN); Qingqing Sun, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 14/480,158

(22) Filed: Sep. 8, 2014

(65) Prior Publication Data

US 2014/0377892 A1 Dec. 25, 2014

Related U.S. Application Data

(62) Division of application No. 13/392,208, filed as application No. PCT/CN2011/000871 on May 19, 2011, now Pat. No. 8,860,179.

(30) Foreign Application Priority Data

May 20, 2010 (CN) .......................... 2010 1 0179375

(51) Int. Cl.
*H01L 21/768* (2006.01)
*H01L 21/66* (2006.01)
(Continued)

(52) U.S. Cl.
CPC .......... *H01L 22/14* (2013.01); *H01L 21/76879* (2013.01); *H01L 23/5227* (2013.01); *H01L 23/645* (2013.01); *H01L 24/94* (2013.01); *H01L 25/0657* (2013.01); *H01L 28/10* (2013.01); *H01L 23/481* (2013.01); *H01L 24/13* (2013.01);
(Continued)

(58) Field of Classification Search
CPC ................ H01L 23/5227; H01L 28/10; H01L 21/76879; H01L 2224/32145; H01L 2225/06541; H01L 23/645; H01L 25/0657
USPC ........................................................ 257/531
See application file for complete search history.

(56) References Cited

U.S. PATENT DOCUMENTS 7,705,421 B1 4/2010 Yegnashankaran
8,860,179 B2 10/2014 Wang et al.
(Continued)

FOREIGN PATENT DOCUMENTS

CN 101866908 A 10/2010

OTHER PUBLICATIONS

International Search Report of PCT/CN2011/000871, mailed Aug. 25, 2011.

*Primary Examiner* — Howard Weiss
*Assistant Examiner* — Tifney Skyles
(74) *Attorney, Agent, or Firm* — Collard & Roe, P.C.

(57) ABSTRACT

The present invention discloses an inductive element formed by through silicon via interconnections. The inductive element formed by means of the special through silicon via interconnection by using through silicon via technology features advantages such as high inductance and density. Moreover, the through silicon via interconnection integrated process forming the inductive element is compatible with the ordinary through silicon interconnection integrated process without any other steps, thus making the process simple and steady. The inductive element using the present invention is applicable to the through silicon via package manufacturing of various chips, especially the package manufacturing of power control chips and radio-frequency chips.

5 Claims, 2 Drawing Sheets

(51) Int. Cl.
    H01L 23/522   (2006.01)
    H01L 23/64    (2006.01)
    H01L 25/065   (2006.01)
    H01L 49/02    (2006.01)
    *H01L 23/48*      (2006.01)
    *H01L 23/00*      (2006.01)
(52) U.S. Cl.
    CPC .............. *H01L 2224/32145* (2013.01); *H01L 2225/06527* (2013.01); *H01L 2225/06541* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01082* (2013.01); *H01L 2924/10253* (2013.01); *H01L 2924/19042* (2013.01)

(56) References Cited

U.S. PATENT DOCUMENTS

2005/0190035 A1\* 9/2005 Wang .......................... 336/200
2009/0032928 A1   2/2009 Chiang et al.
2010/0019346 A1   1/2010 Erturk et al.

\* cited by examiner

METHOD OF FORMING AN INTEGRATED INDUCTOR BY DRY ETCHING AND METAL FILLING

CROSS REFERENCE TO RELATED APPLICATIONS

This application is a divisional application of Ser. No. 13/392,208 filed on Feb. 24, 2012, which is the National Stage of PCT/CN2011/000871 filed on May 19, 2011, which claims priority under 35 U.S.C. '119 of People's Republic of China Application No. 201010179375.0 filed on May 20, 2010, the disclosure of all of these applications are incorporated by reference. The international application under PCT article 21(2) was not published in English.

TECHNICAL FIELD

The present invention belongs to the technical field of highly integrated packaging technology, and relates to an integrated packaging technology using through silicon vias, and especially to an inductive loop formed by through silicon vias.

DESCRIPTION OF THE RELATED ART

Currently, three-dimensional packaging technology has been developed such as the through silicon via (TSV) interconnection packaging technology at the wafer level from the stacked die packaging or package on package at chip level.

Through silicon via is such a technology that, through making vertical vias between the silicon wafers and forming interconnection micro-joints on the front and back of the silicon wafers, several silicon wafers can be stacked directly without external lead wire interconnections. Through silicon via technology can be classified into two kinds, via first and via last. Via first is a technology where interconnection via are formed on the silicon wafers before finishing manufacturing the integrated circuit, wherein the through silicon via interconnection can be formed both at the primary steps of chip manufacturing and before BEOL (Back-end of Line). While via last is a technology where through silicon vias are interconnected after BEOL or finishing manufacturing the integrated circuit. The filling materials in the through silicon via include an insulation layer and a metal layer or highly-doped polycrystalline silicon used for electricity conduction. In order to decrease interconnection resistance and improve the working frequency of the chip, in the through silicon via three-dimensional package with multiple sensing systems, it is more preferable to use copper as the through silicon via interconnection metal. Different from the previous IC package bonding or the stacking technology using bumps, through silicon via interconnection technology can maximize the stacking density and minimize the external dimensions of the chip in three-dimensional direction, and improve the speed and performance of low power consumption greatly.

The integrated circuit made of silicon has a wide application prospect in the radio-frequency circuit field. The radio-frequency inductive element has an indispensable effect on the requirements of portable wireless communication equipment in low power voltage, power consumption, power dissipation, distortion and high working frequency, etc. However, seen from the silicon integrated circuit process of current standards, the inductive element is very difficult to be integrated or has very low inductance if integrated.

BRIEF SUMMARY OF THE INVENTION

With respect to the problems above, the present invention aims at providing an inductive element used in silicon integrated circuits, wherein the inductive element is easy to be integrated in chips and has a high inductance.

To achieve the above purpose, the present invention provides an inductive loop used to form through silicon via interconnections, comprising:

A semiconductor substrate;

Two or more (more than two) silicon wafers with finished through silicon via structures;

Interconnection joints formed on the front and back of the silicon wafers;

An inductive element formed on the semiconductor substrate, which is used to stack and interconnect the silicon wafers.

The semiconductor substrate is made of monocrystalline or polycrystalline silicon or silicon on insulators (SOI). The through silicon via structures of the silicon wafers comprises at least a conductive layer and an insulation layer isolating the conductive layer from the through silicon via surface. The insulation layer is made of silicon dioxide, or silicon nitride or the insulation substance of their combination. The conductive layer is made of aluminium, or copper or doped polycrystalline silicon.

DETAILED DESCRIPTION OF THE INVENTION

Figure 1:
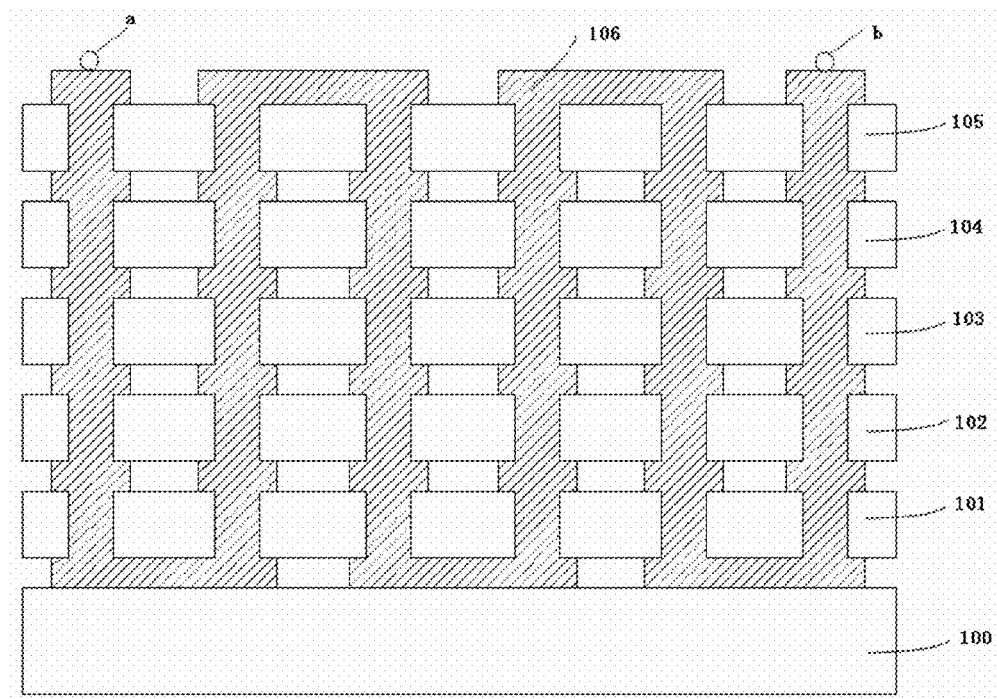
FIG. 1 is the cross sectional view of an inductive element formed by interconnecting the through silicon vias by means of through silicon via technology of the present invention.

An exemplary embodiment of the present invention is further detailed herein by referring to the drawings. The reference drawings are the schematic diagrams of the ideal embodiments of the present invention. The embodiments below are for description only rather than restricting the present invention.

Provide a semiconductor and several silicon wafers with through silicon vias and finished interconnection joints. In the embodiment, five silicon wafers with through silicon vias structure and finished interconnection joints are provided.

Next, stack and interconnect the five silicon wafers alternatively on the semiconductor substrate, as shown in FIG. 1, the semiconductor substrate 100 can be monocrystalline or polycrystalline silicon or silicon on insulators (SOI). 101, 102, 103, 104 and 105 are the five silicon wafers with through silicon vias and interconnection joints finished in the embodiment. 106 is the metal conductor after the through silicon via interconnection, wherein the metal conductor 106 comprises a conductive layer and an insulation layer isolating the conductive layer from the through silicon via surface. a and b are two measurement nodes introduced in the embodiment.

Figure 2:
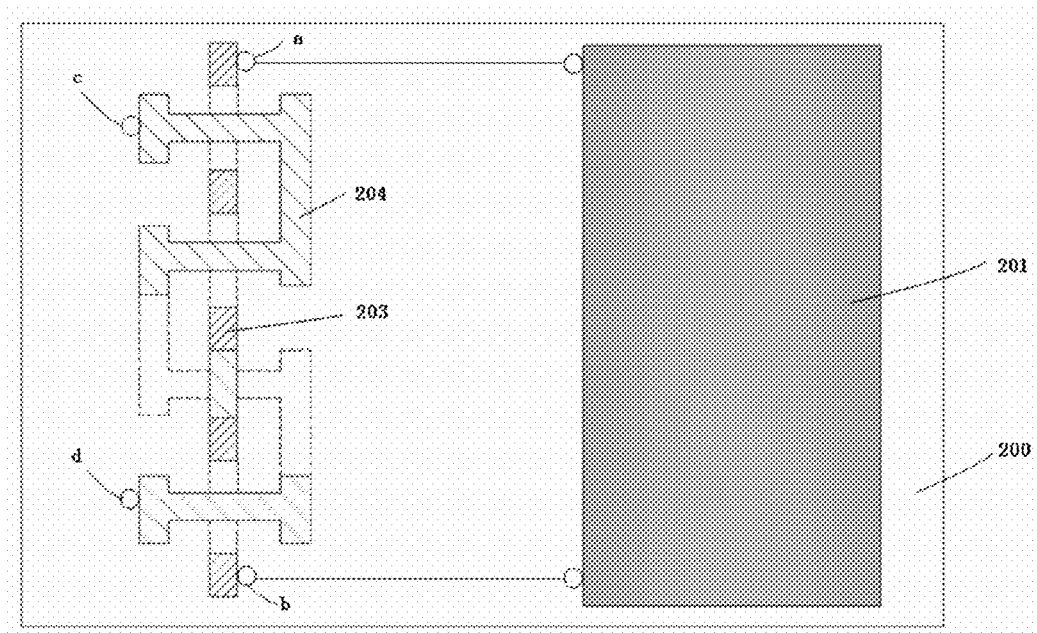
FIG. 2 is the top view of an embodiment integrating an inductive element with a analog or logic circuit of the present invention.

The inductive element provided by the present invention, which is used to form through silicon via interconnections, is compatible with simulation or logic circuits. FIG. 2 is the top view when integrating the inductive element provided by the embodiment of the present invention with a simulation or logic circuit. As shown in FIG. 2, 200 is a semiconductor substrate made of monocrystalline or polycrystalline silicon, wherein 201 is logic or simulation circuit, 203 is the interconnection metal conductor between measurement nodes a and b, which can be made of aluminium or copper, and 204 is the interconnection metal conductor between measurements c and d, which can be made of aluminium or copper.

Figure 3:
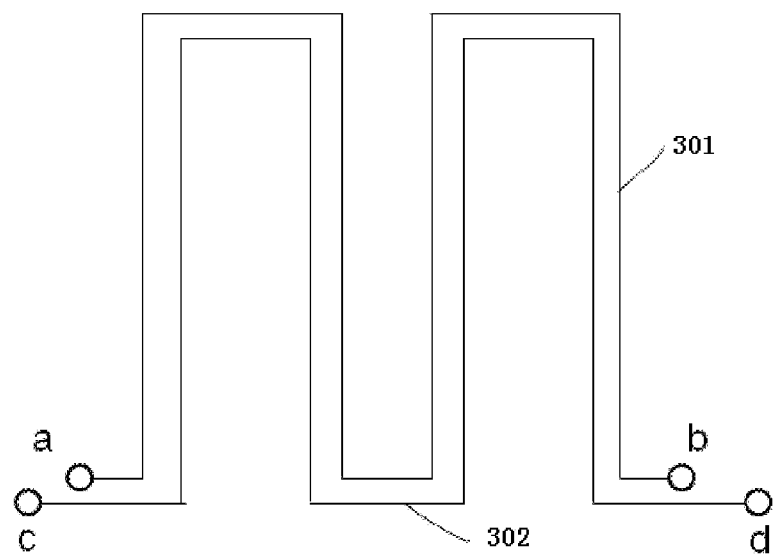
FIG. 3 is the schematic view when an inductive element works according to the present invention.

FIG. 3 is the schematic diagram when the inductive element provided by the embodiment of the present invention, wherein 301 and 302 are the interconnection metal conductors between measurement nodes a, b and c, d respectively. Connecting the measurement nodes a, b, c and d in different schemes, inductive elements with different inductances can be made. Two connection schemes are provided in the embodiment.

Scheme 1: applying a specific current between measurement nodes c and d, the current flows through the metal conductor 302 and forms an electromagnetic field around the metal conductor 302, thus the metal conductor 301 between measurement nodes a and b is an inductive element.

Scheme 2: connect measurement nodes c and d in a short circuit method, and then the metal conductor 302 can form a closed loop to be an inductive element capable of forming mutual inductance with the inductive element formed by the metal conductor 301.

As described above, there are many significantly different embodiments without deviating from the spirit and scope of the present invention. It shall be understood that the present invention are not limited to the specific embodiments described in the Specification except those limited by the Claims herein.

INDUSTRIAL APPLICABILITY

The inductive element formed by means of the special through silicon via interconnection by using through silicon via technology features advantages such as high inductance and density. Moreover, the through silicon via interconnection integrated process forming the inductive element is compatible with ordinary through silicon interconnection integrated process without any other steps, thus making the process simple and steady. The inductive element of the present invention is applicable to the through silicon via interconnection package manufacturing of various chips, especially the package manufacturing of power control chip and radio-frequency chip.

The invention claimed is:

1. A process for creating an inductive loop comprising:
    a) connecting a first set of measurement nodes in a short circuit method;
    b) forming a closed loop around a metal conductor to form an inductive element;
    c) forming mutual inductance with said inductive element being formed by said metal conductor.

2. The process as in claim 1, wherein said step of forming an inductive element comprises providing at least one semiconductor.

3. The process as in claim 1, wherein said step of providing at least one semiconductor comprises:
    stacking and interconnecting a plurality of silicon wafers alternatively on a semiconductor substrate.

4. The process as in claim 3, wherein said step of providing at least one semiconductor comprises providing at least one monocrystalline silicon or monocrystalline silicon on an insulator.

5. The process as in claim 1, wherein said step of providing at least one semiconductor comprises providing at least one polycrystalline silicon or polycrystalline silicon on an insulator.

* * * * *